United States Patent
Kang et al.

(10) Patent No.: US 7,153,087 B2
(45) Date of Patent: Dec. 26, 2006

(54) CENTERING MECHANISM, CENTERING UNIT, SEMICONDUCTOR MANUFACTURING APPARATUS, AND CENTERING METHOD

(75) Inventors: Ki Sang Kang, Suwon (KR); Shuji Akiyama, Nirasaki (JP); Hiroki Hosaka, Nirasaki (JP)

(73) Assignees: Samsung Electronics Co., Ltd., Suwon (KR); Tokyo Electron Limited, Tokyo (JP)

( * ) Notice: Subject to any disclaimer, the term of this patent is extended or adjusted under 35 U.S.C. 154(b) by 407 days.

(21) Appl. No.: 10/351,088

(22) Filed: Jan. 27, 2003

(65) Prior Publication Data
US 2003/0160401 A1  Aug. 28, 2003

(30) Foreign Application Priority Data
Jan. 28, 2002  (JP) .................. 2002-018848

(51) Int. Cl.
*B65G 47/24* (2006.01)

(52) U.S. Cl. .............. 414/781; 414/816; 414/936; 414/941

(58) Field of Classification Search .......... 414/155, 414/781, 936, 941, 816; 294/2
See application file for complete search history.

(56) References Cited

U.S. PATENT DOCUMENTS

| | | | | |
|---|---|---|---|---|
| 4,507,078 A | * | 3/1985 | Tam et al. ............. | 432/11 |
| 4,655,584 A | * | 4/1987 | Tanaka et al. .......... | 355/53 |
| 4,770,600 A | * | 9/1988 | Ishikawa ............... | 414/783 |
| 4,880,348 A | * | 11/1989 | Baker et al. ........... | 414/783 |
| 5,037,262 A | * | 8/1991 | Moll et al. ............ | 414/222.04 |
| 5,549,444 A | * | 8/1996 | Dubuit ................. | 414/796.7 |
| 6,203,268 B1 | * | 3/2001 | Miyashita ............. | 414/757 |
| 6,309,163 B1 | * | 10/2001 | Nering ................. | 414/331.01 |
| 6,390,767 B1 | * | 5/2002 | Alper et al. .......... | 414/941 |
| 6,409,463 B1 | * | 6/2002 | Croft et al. .......... | 414/754 |
| 6,508,885 B1 | * | 1/2003 | Moslehi et al. ........ | 118/728 |
| 6,547,504 B1 | * | 4/2003 | Shinozuka ............. | 414/222.01 |

FOREIGN PATENT DOCUMENTS

| | | |
|---|---|---|
| JP | 7-7069 | 1/1995 |
| JP | 9-321124 | 12/1997 |
| JP | 10-303270 | 11/1998 |

* cited by examiner

*Primary Examiner*—Douglas Hess
(74) *Attorney, Agent, or Firm*—Oblon, Spivak, McClelland, Maier & Neustadt, P.C.

(57) ABSTRACT

A centering unit comprises a plate, centering mechanism, link mechanism, and cylinder mechanism. The plate vertically divides the interior of a frame. The support table is located substantially on the center of the plate. The centering mechanism can center each wafer on the support table. Centering plates of the centering mechanism are located on either side of the support table and have engaging surfaces and that extend along the outer peripheral surface of the wafer. The link mechanism and the cylinder mechanism serve to extend and contract the space between the centering plates.

9 Claims, 4 Drawing Sheets

CENTERING MECHANISM, CENTERING UNIT, SEMICONDUCTOR MANUFACTURING APPARATUS, AND CENTERING METHOD

CROSS-REFERENCE TO RELATED APPLICATIONS

This application is based upon and claims the benefit of priority from the prior Japanese Patent Application No. 2002-018848, filed Jan. 28, 2002, the entire contents of which are incorporated herein by reference.

BACKGROUND OF THE INVENTION

1. Field of the Invention

The present invention relates to a centering mechanism, centering unit, semiconductor manufacturing apparatus, and centering method, and more specifically, to a centering mechanism for securely delivering objects to be processed between an automated transportation device and a semiconductor manufacturing apparatus, a centering unit provided with the centering mechanism, a semiconductor manufacturing apparatus, and a centering method.

2. Description of the Related Art

In an inspection process of a semiconductor manufacturing apparatus, for example, probers are used as testing units for integrated circuits (hereinafter referred to as "devices") that are formed on a semiconductor wafer (hereinafter referred to simply as "wafer"). Usually, a prober comprises a loader chamber and a prober chamber. The loader chamber includes a stage portion, wafer transportation mechanism, and pre-alignment mechanism. The stage portion carries thereon a carrier that is stored with a plurality of wafers (e.g., 25 wafers). The wafer transportation mechanism (hereinafter referred to as "arm mechanism") transports the wafers one after another from the carrier stage portion. The pre-alignment mechanism (hereinafter referred to as "sub-chuck") pre-aligns the wafers transported by means of the arm mechanism.

The prober chamber is a section for testing the devices on the wafer for electrical properties. The prober chamber is provided with a step (hereinafter referred to as "main chuck"), alignment mechanism, probe card, and test head. The main chuck carries the wafer thereon and moves in X-, Y-, Z-, and θ-directions. The alignment mechanism, in conjunction with the main chuck, aligns the wafer with respect to the probe card. The probe card is located over the main chuck. The test head is located between the probe card and a tester and electrically connects the two.

In testing the devices on the wafer for electrical properties, an operator places the carrier, which is stored with a plurality of wafers in a lot, on the carrier stage portion of the loader chamber. When the prober is actuated, the arm mechanism takes out the wafers in the carrier one after another, the pre-alignment mechanism pre-aligns the wafers, and the arm mechanism delivers the wafers onto the main chuck in the prober chamber.

In the loader chamber, the main chuck and the alignment mechanism align the wafers. The main chuck indexes the aligned wafers. Every time each wafer is indexed, probes of the probe card come electrically into contact with electrodes of the devices on the wafer, whereupon the tester tests the devices for predetermined electrical properties. After the checkup, the arm mechanism of the loader chamber receives the wafer on the main chuck and restores it to its original position in the carrier. The next wafer is checked up by repeating these steps of operation. When the inspection of all the wafers in the carrier is finished, the operator replaces the carrier with another carrier, whereupon devices on each wafer in the new carrier are checked for electrical properties.

If the diameter of each wafer is 300 mm or more, for example, the carrier that stores a plurality of wafers is so heavy that the operator can hardly carry the carrier around, which could be dangerous. This problem is not limited to probers, and is common to semiconductor manufacturing apparatuses and other apparatuses that process wafer-type substrates.

Proposed in Jpn. Pat. Appln. KOKAI Publication No. 10-303270 is a method of transportation in which an automated transportation vehicle (hereinafter referred to as "AGV") transports carriers so that wafers of the same lot can be delivered in each carrier between the AGV and equipment in each process or stage.

If the wafers have large diameters or advanced hyperfine structures, processing each wafer takes longer. Thus, according to the method for processing the wafers in each carrier, the processed wafers are inevitably detained in the apparatus for a long period of time, which lowers the production efficiency. Accordingly, a single wafer processing system is proposed such that the semiconductor manufacturing apparatus processes the wafers that are delivered one after another between itself and the automated transportation vehicle. This single wafer processing system can increase the production efficiency. If the positional accuracy of the delivery of the wafers between the automated transportation vehicle and the semiconductor manufacturing apparatus is poor, according to this system, however, the wafers cannot be delivered accurately. The single wafer processing system requires construction of a general-purpose automated transportation system that can handle wafers of different diameters at the same time.

BRIEF SUMMARY OF THE INVENTION

The present invention has been made to solve the above problems. The object of the invention is to provide a centering mechanism, centering unit, semiconductor manufacturing apparatus, and centering method, in which an object to be processed can be securely delivered between an AGV and a semiconductor manufacturing apparatus.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

According to a first aspect of the invention, there is provided a centering mechanism which centers a to-be-processed object. The centering mechanism comprises a support table to carry the to-be-processed object thereon, at least one centering plate located on either side of the support table and having an engaging surface extending along the outer peripheral surface of the to-be-processed object, and a drive mechanism to move the centering plate relatively to the to-be-processed object.

According to a second aspect of the invention, there is provided a centering unit, which comprises the centering mechanism according to the first aspect and a storage section storing a plurality of to-be-processed objects.

According to a third aspect of the invention, there is provided a semiconductor manufacturing apparatus that has a main chuck to carry a to-be-processed object and a processing mechanism which processes the to-be-processed object on the main chuck as specified. The semiconductor manufacturing apparatus comprises a centering mechanism to center the to-be-processed object and a transportation mechanism which transports the to-be-processed object between the centering mechanism and the main chuck. The centering mechanism includes a support table to carry the to-be-processed object thereon, at least one centering plate located on either side of the support table and having an engaging surface extending along the outer peripheral surface of the to-be-processed object, and a drive mechanism to move the centering plate relatively to the to-be-processed object.

According to a fourth aspect of the invention, there is provided a method of centering a to-be-processed object on a support table. The method comprises placing the to-be-processed object on the support table, moving at least one centering plate, located on either side of the support table and having an engaging surface extending along the outer peripheral surface of the to-be-processed object, toward to the object, bringing the engaging surface of the centering plate into contact with the outer peripheral surface of the to-be-processed object, and pressing the outer peripheral surface of the to-be-processed object to move the object by using the engaging surface of the centering plate, thereby locating the object in a center position.

Preferably, the centering mechanism, centering unit, semiconductor manufacturing apparatus, or centering method according to the first, second, third, or fourth aspect comprises any one of the following elements (1) to (6) or a combination of any of the elements:

(1) a lift mechanism to raise and lower the support table, (2) the centering plate includes a pair of centering plates, and the drive mechanism extends and contracts the space between the centering plates by moving at least one of the centering plates, (3) engaging surfaces formed on the centering plate (the engaging surfaces being formed in a plurality of tiers extending individually along the respective outer peripheral surfaces of to-be-processed objects having different sizes in order to correspond to the to-be-processed objects of a plurality of types), (4) a drive mechanism including a link mechanism coupled to at least one of shafts supporting the centering plates and a cylinder mechanism coupled to the link mechanism, (5) a storage section having a portion storing to-be-processed objects of a plurality of types having different sizes, and (6) a mechanism which delivers the to-be-processed object between an automated transportation device and the support table.

BRIEF DESCRIPTION OF THE SEVERAL VIEWS OF THE DRAWING

The accompanying drawings, which are incorporated in and constitute a part of the specification, illustrate preferred embodiments of the invention, and together with the general description given above and the detailed description of the preferred embodiments given below, serve to explain the principles of the invention.

DETAILED DESCRIPTION OF THE INVENTION

A centering mechanism, centering unit, and centering method for an object to be processed, according to the present invention, are applicable to any apparatuses that require centering of the object, besides a semiconductor manufacturing apparatus. To explain the invention specifically, the centering mechanism and the like that are used for a probe apparatus which checks devices on a wafer for electrical properties. Thus, the present invention is not limited to a probe apparatus.

Figures 1A, 1B:
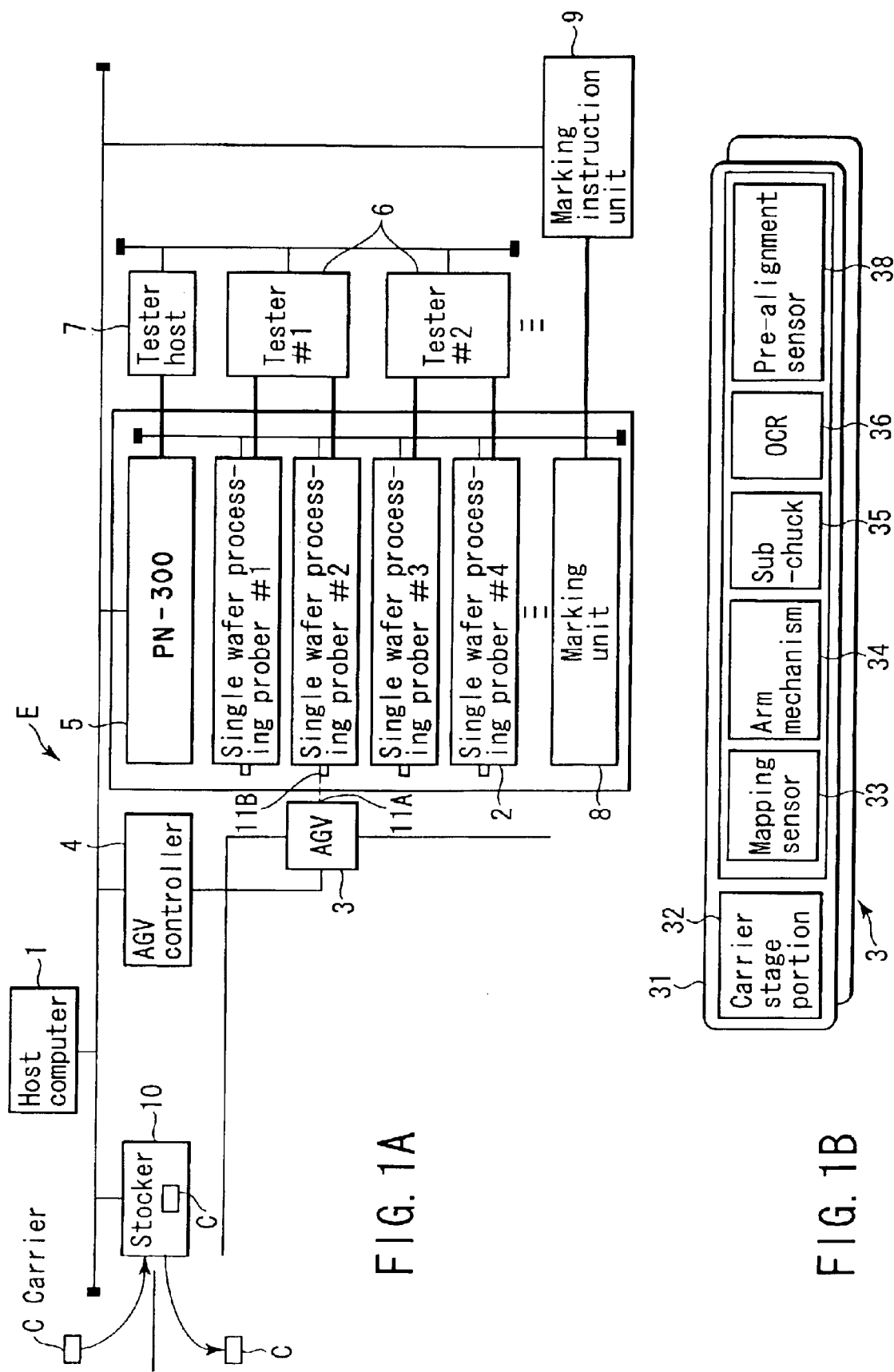
FIG. 1A is a schematic representation showing an example of a transportation system for to-be-processed objects according to the invention.
FIG. 1B is a schematic representation showing a configuration of an AGV.

An embodiment of the invention will now be described with reference to FIGS. 1A to 4. The following is a description of a transportation system for an object to be processed (e.g., wafer) that can be applied to the centering unit and the semiconductor manufacturing apparatus of the invention. As shown in FIGS. 1A and 1B, this transportation system (automated material handling system (AMHS)) E may comprise a host computer 1, testing units (e.g., probers) 2, automated transportation devices (hereinafter referred to as "AGV's") 3, and a transportation control unit (hereinafter referred to as "AGV controller") 4. The host computer 1 controls general production of a plant that includes a wafer inspection process. Each prober 2 checks wafers for electrical properties under the control of the host computer 1. Each AGV 3 has wafers W of a plurality of types having different diameters that are required by each prober 2, and automatically transports the wafers one after another to each prober. The AGV controller 4 serves to control the AGV's 3. The probers 2 and the AGV's 3 can share an optically-coupled parallel I/O (hereinafter referred to as "PIO") communication interface that is based on SEM1 standards E23 and E84, for example. The wafers W are delivered one after another between each prober 2 and each AGV 3 under PIO communication. The prober 2 may be formed as a single wafer processing-type prober that can receive and check up the wafers W one after another. The single wafer processing-type prober 2 will hereinafter be referred to simply as prober 2. The AGV controller 4 is connected to the host computer 1 by means of a SECS (semiconductor equipment communication standard) line of communication. The AGV controller 4 can control the AGV 3 by radio communication and manage the wafers W in lots under the control of the host computer 1. An RGV may be used in place of the AGV 3 as the automated transportation device of the transportation system. The automated transportation vehicle of the transportation system may be provided with an OHT or the like, as well as an AGV 3 and the RGV. An OHT may transport the wafers along a ceiling track.

As shown in FIG. 1, the probers 2 are connected to the host computer 1 through a group controller 5 and the SECS line of communication. The host computer 1 manages the probers 2 by controlling the group controller 5. The group controller 5 manages information on the inspection of recipe data, log data, etc. of the probers 2. Each of the probers 2 is connected to its corresponding tester 6 by means of the SECS line of communication. Each prober 2 executes a predetermined checkup in accordance with a command from its corresponding tester 6. These testers 6 are connected to the host computer 1 through a tester host computer (hereinafter referred to as "tester host") 7 and the SECS line of communication. The host computer 1 manages the testers 6 by controlling the tester host 7. A marking unit 8 is connected to the host computer 1 through a marking instruction unit 9. The marking unit 8 puts a specific mark on each wafer in accordance with the result of inspection of the wafer. Based on data from the tester host 7, the marking instruction unit 9 instructs the marking unit 8 on marking. A stocker 10 for storing carriers C is connected to the host computer 1 by means of the SECS line of communication. The stocker 10 serves to store, classify, and transfer the untested and tested wafers in carriers under the control of the host computer 1.

Figure 2:
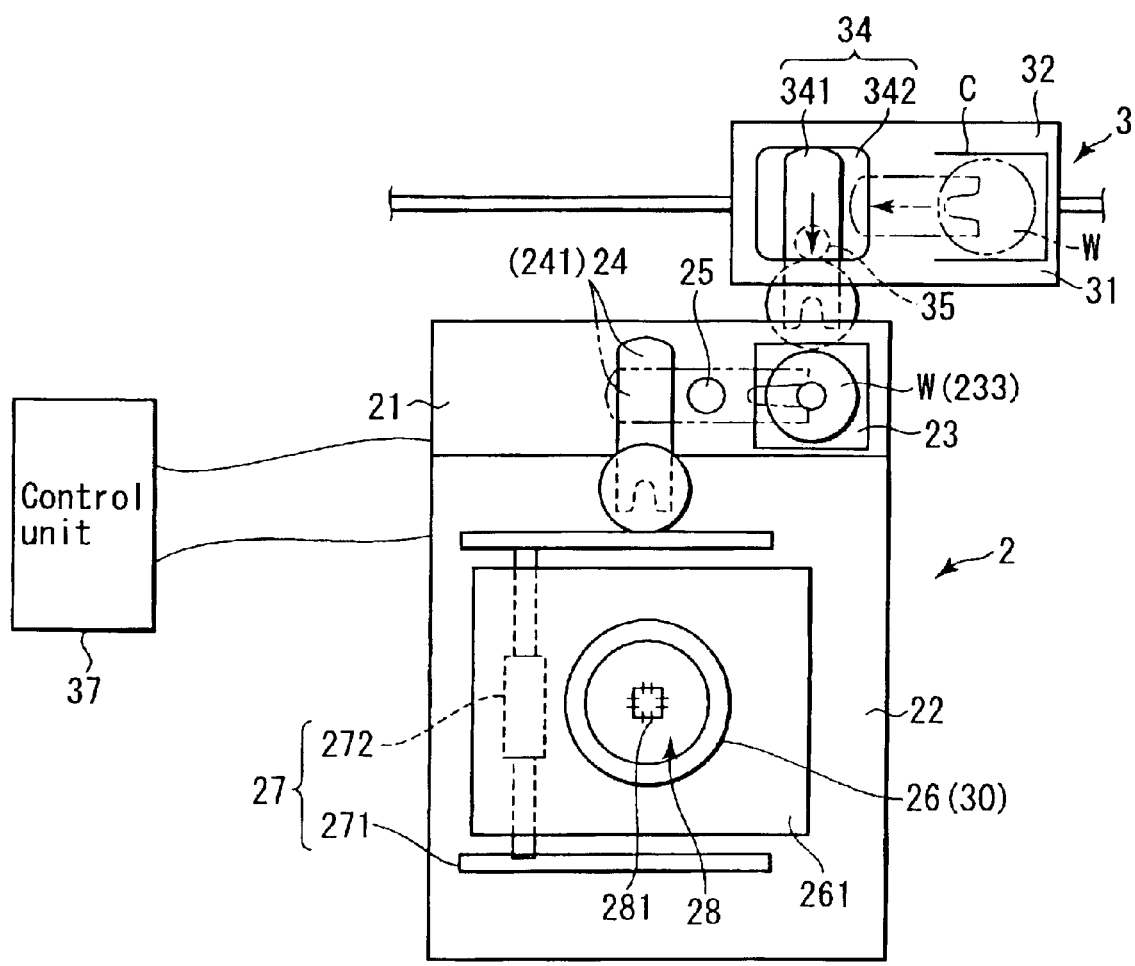
FIG. 2 is a plan view schematically showing the way a wafer is delivered between a prober chamber and the AGV.

As shown in FIG. 2, each prober 2 of the present embodiment comprises a loader chamber 21, a prober chamber 22, and a control unit 37. Devices in the loader chamber 21 and the prober chamber 22 operate under the control of the control unit 37.

The loader chamber 21 includes a centering unit 23, an arm mechanism 24, and a sub-chuck 25. The loader chamber 21 may be constructed in the same manner as a conventional loader chamber except for the centering unit 23 of the present embodiment.

Figure 3A:
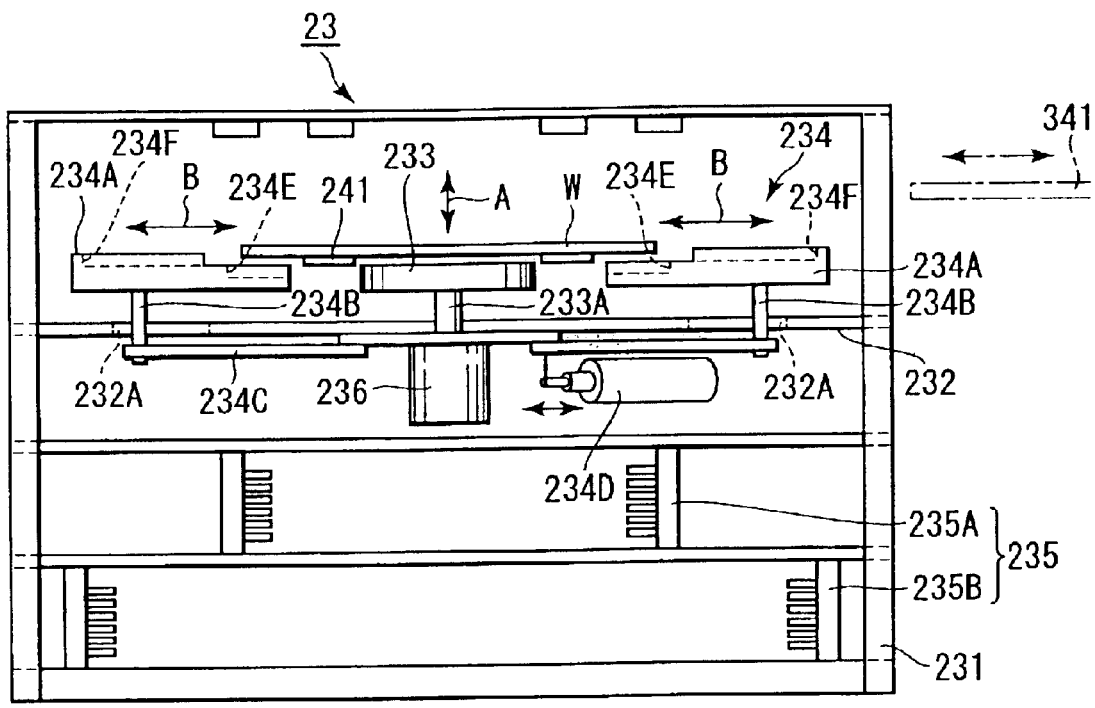
FIG. 3A is a front view showing an embodiment of a centering unit of the invention.

As shown in FIG. 3A, the centering unit 23 of the present embodiment can comprise a plate 232, support table 233, centering mechanism 234, and wafer storage section 235. The plate 232 vertically divides the interior of a frame 231. The support table 233 is located substantially on the center of the plate 232. The centering mechanism 234 can center each wafer W on the support table 233. The wafer storage section 235 is formed under the plate 232. It temporarily stores a plurality of wafers W (e.g., six in number) that have different diameters of 200 mm and 300 mm, for example. The wafer storage section 235 can be raised and lowered by means of a lift mechanism (e.g., indexer).

Figure 3B:
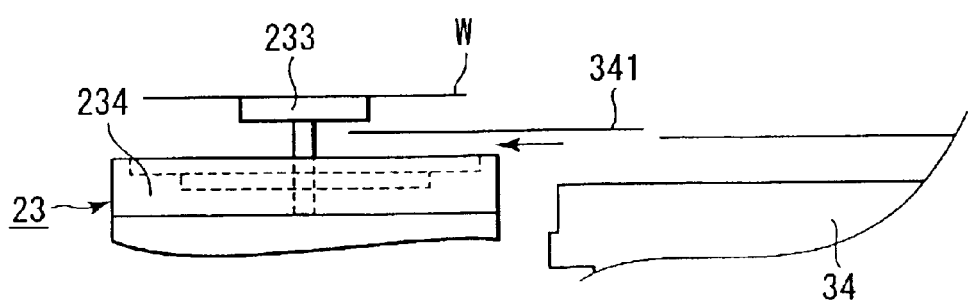
FIG. 3B is a side view showing operation for receiving a wafer from the AGV.
Figure 3C:
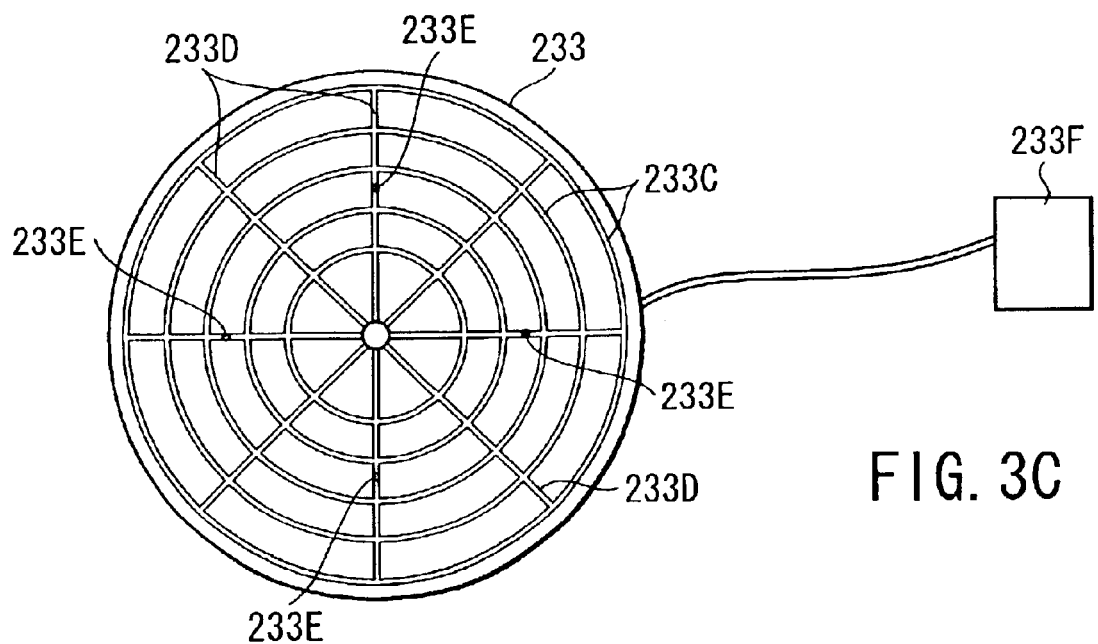
FIG. 3C is a plan view schematically showing a support table.

A shaft 233A that supports the support table 233 penetrates the plate 232, and is coupled to an air cylinder 236 that is fixed to the reverse of the plate 232. The air cylinder 236 can raise or lower the shaft 233A in the direction of arrow A of FIG. 3A. As shown in FIG. 3C, a plurality of concentric grooves 233C and radial grooves 233D can be formed on the obverse of the support table 233. One end 233E of each of vacuum exhaust passages opens in a suitable spot in its corresponding groove. A vacuum exhaust unit 233F is connected to the vacuum exhaust passages. As the vacuum exhaust unit evacuates spaces between the grooves of the support table 233 and the wafer W, the wafer W is attracted to the obverse of the support table 233 by vacuum suction.

As shown in FIG. 3A, the centering mechanism 234 may comprise centering plates 234A, shafts 234B, link mechanism 234C, and cylinder mechanism (e.g., air cylinder) 234D. The paired centering plates 234A, left and right, may be located so as to hold the support table 233 between them from the left- and right-hand sides, as viewed from the arm mechanism 24 of the prober 2 in FIG. 2.

The centering plates 234A center the wafer W by holding it from left- and right-hand sides. Preferably, this holding operation should be carried out with the wafer W lifted above the centering plates 234A. This state can be realized when the air cylinder 236 lowers the support table 233, as shown in FIG. 3A. Alternatively, however, the holding operation can be carried out with the wafer W placed on the support table 233. Further, the paired centering plates shown in FIG. 3A may be arranged so that one of them is fixed and the other can move from side to side.

The shafts 234B support their corresponding centering plates from below. Preferably, they individually penetrate slots 232A in the plate 232.

The link mechanism 234C is coupled to each of the shafts 234B under the plate 232. The cylinder mechanism 234D is coupled to the link mechanism 234C.

The cylinder mechanism 234D causes the link mechanism 234C to extend and contract the space between the left- and right-hand centering plates 234A, as indicated by arrow B in FIG. 3A. The wafer W is centered as the space between the centering plates 234A is extended and contracted.

In order to hold wafers W of different outside diameters (e.g., 200 mm and 300 mm), the centering plates 234A may have stepped engaging surfaces (arcuate surfaces) 234E and 234F that match the outside diameter of the wafer W. The engaging surfaces 234E and 234F need not always be arcuate surfaces. They must only have shapes such that they can accurately move the wafer W in a given direction as they touch the side face of the wafer W to hold the wafer between the centering plates.

When the support table 233 delivers, for example, a 200-mm wafer W to the centering mechanism 234, left- and right-hand centering plates 234A are separated at a distance longer than the diameter of the wafer W, as shown in FIG. 3A. In this state, the cylinder mechanism 234D shortens the space between the paired centering plates 234A, and the air cylinder 236 lowers the support table 233, whereupon the wafer W is placed on the centering plates 234A.

The cylinder mechanism 234D causes the link mechanism 234C to bring the left- and right-hand centering plates 234A close to each other. The wafer W is centered as the respective arcuate surfaces 234E or 234F of the centering plates 234A hold the wafer W between them.

As shown in FIG. 3A, the wafer storage section 235 has first and second wafer storage chambers 235A and 235B, which can be located above and below. For example, the first storage chamber 235A stores 200-mm wafers W, and the second storage chamber 235B stores 300-mm wafers W. Preferably, the respective fronts of the first and second wafer storage chambers 235A and 235B should be substantially trued up. As mentioned later, the wafer storage section 235 can serve as a buffer that temporarily stores the wafers W.

As shown in FIG. 2, the arm mechanism 24 has two arms 241, upper and lower. Each arm 241 holds a wafer W by vacuum suction. When each arm 241 is released from the vacuum suction, it delivers to or receives each wafer W from the centering unit 23. Each arm 241 transports the wafer W received from the centering unit to the prober chamber 22. As the arm mechanism 24 transports the wafer W, the sub-chuck 25 pre-aligns the wafer W.

The prober chamber 22 has a main chuck 26, an alignment mechanism 27, and a processing mechanism (e.g., probe card) 28. The main chuck 26 can be moved in the X- and Y-directions by means of an X-Y table 261, and moved in the Z- and θ-directions by means of a lift mechanism and a θ-rotation mechanism (not shown). The alignment mechanism 27, like a conventional one, has an alignment bridge 271, CCD camera 272, etc. The alignment mechanism 27, in conjunction with the main chuck 26, aligns the wafer W with the probe card 28. The probe card 28 has a plurality of probes 281. The probes 281 come into electrical contact with the electrodes of an object of inspection that is formed on the wafer W on the main chuck 26. In this contact state, the probes 281 connect the object of inspection to the tester 6 with the aid of a test head (not shown).

As shown in FIGS. 1B and 2, the AGV 3 may comprise a device body 31, carrier stage portion 32, mapping sensor 33, delivery mechanism (e.g., arm mechanism) 34, optical pre-alignment sensor 38, optical character reader (OCR) 36, and sub-chuck 35.

The carrier stage portion 32 is located on one end portion of the device body 31 and carries the carrier C thereon. The mapping sensor 33 detects the position of the wafer W stored in the carrier C. The arm mechanism 34 transports the wafer W from and into the carrier C. The optical character reader (OCR) 36 reads an ID code of the wafer W. The sub-chuck 35 aligns the wafer W.

The AGV is controlled by means of the AGV controller 4 through radio communication. The AGV automatically travels between the stocker 10 and the probers 2 or between the probers 2 as it transports the carriers C. The arm mechanism 34 distributes the wafers W in the carriers C, transported by means of the AGV, one after another to the probers 2. Each carrier C can store a plurality of wafers with different diameters. For example, the carrier C can be divided into two parts, upper and lower. The upper part stores a plurality of 200-mm wafers, and the lower part stores a plurality of 300-mm wafers.

Preferably, the arm mechanism 34 is constructed so that it can rotate, ascend, and descend as it delivers the wafer W. As shown in FIG. 2, the arm mechanism 34 can comprise arms 341, a base 342, and a drive mechanism. Preferably, the arms 341 include upper and lower arms that can hold the wafer W by vacuum suction. The base 342 supports the arms 341 for longitudinal movement and can be rotated forwardly and reversely. A drive mechanism for driving the arm 341 is set in the base 342.

In delivering the wafer W, each of the arms 341 is moved back and forth on the base 342 by means of the drive mechanism. The base 342 can be rotated forwardly and reversely in the direction to deliver the wafer W.

When the AGV 3 reaches the position for the delivery of the wafers W to the prober 2 under the control of the AGV controller 4, the arm mechanism 34 of the AGV 3 takes out the wafers W one after another from the carrier C. When the arm mechanism 34 of the AGV 3 delivers the wafer W to the centering unit 23 of the prober 2, the prober 2 and the AGV 3 are connected by optically-coupled PIO communication, whereupon specifications of the wafer W and the like are transmitted. Thus, the one wafer W can be delivered accurately.

The arm mechanism 34 of the AGV 3 ascends or descends, and the upper arm 341 takes out a wafer W to be proved, from a buffer cassette 32. After the upper arm 341 is contracted, the arm mechanism 34 is rotated clockwise by 90° by means of its base 342. As this is done, the arm 341 is directed toward the centering unit 23 of the prober 2. As shown in FIG. 3A, the upper arm 341 advances toward the centering unit 23. The wafer W reaches the position over the support table 233 of the centering unit 23, as indicated by dashed line in FIG. 3B. As this is done, the support table 233 is raised by means of the air cylinder 236 and receives the wafer W from the upper arm 341, as shown in FIG. 3B. When the air cylinder 236 lowers the support table 233, the wafer W is placed on the paired centering plates 234A that spread out left and right from the support table 233. The support table 233 is released from the suction, and the wafer W is delivered onto the centering plates 234A. The cylinder mechanism 234D and the link mechanism 234C bring the left- and right-hand centering plates 234A close to each other. If the specifications transmitted by communication relate to wafers W with small diameters, the respective arcuate surfaces 234E of the left- and right-hand centering plates 234A hold the wafer W between them. If the transmitted specifications relate to wafers with large diameters, the respective arcuate surfaces 234F of the centering plates 234A hold the wafer W between them. The wafer W is automatically centered as the cylinder mechanism 234D and the link mechanism 234C bring the left- and right-hand centering plates 234A closer to each other. Even if the wafer W is placed on the support table 233 with a deviation from the center position, the centering plates 234A can securely center the wafer W.

After the wafer W is centered in the loader chamber 21, the arms 241 of the wafer transportation mechanism 24 advance into the centering unit 23, as shown in FIG. 3A. The arms 241 attract the wafer W by vacuum suction, and the left- and right-hand centering plates 234A spread. After the wafer transportation mechanism 24 retreats the arms 241 from the centering unit 23, they transport the wafer W to the prober chamber 22. While the wafer W is being transported, it is pre-aligned on the sub-chuck 25, and the OCR reads the ID code of the wafer W on the sub-chuck 25. After the wafer W is pre-aligned, the arms 241 of the wafer transportation mechanism 24 receive the wafer W again from the sub-chuck 25. The arms 241 move toward the prober chamber 22.

As this is done, the main chuck 26 moves to its standby position in the prober chamber 22. As the arms 241 of the wafer transportation mechanism 24 advance, they deliver the wafer W to the main chuck 26. When the wafer W is placed on the main chuck 26, a suction mechanism 30 that is attached to the main chuck fixes the wafer W by suction. After the inspection, the wafer W is returned along a return path into the centering unit 23. If a wafer W is being delivered between the centering unit 23 and the AGV 3 when the wafer transportation mechanism 24 returns the wafers W into the centering unit, the wafer transportation mechanism 24 temporarily stores the tested wafers W in the wafer storage section 235. The wafer storage section 235 fulfills its buffer function.

Figure 4:
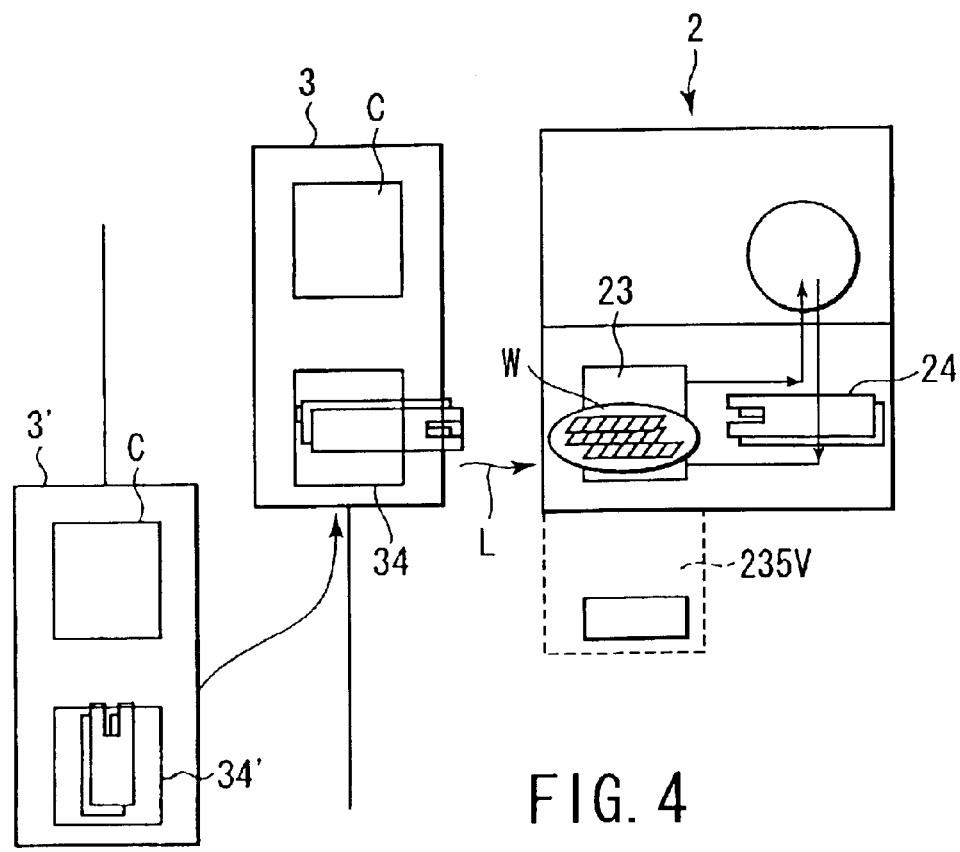
FIG. 4 is a view showing the way wafers are temporarily stocked in a wafer storage section shown in FIG. 3A.

If a plurality of AGV's 3 are set in place, each prober 2 can deliver to and receive the wafers W from the AGV's 3. If the prober 2 is testing a wafer W, and another AGV 3' is accessing to the prober 2 accessed by another AGV 3' to transport another lot of, as shown in FIG. 4, for example, PIO communication is enjoyed between the other AGV 3' and the prober 2. In consequence, a vacant space 235V (indicated by broken line in FIG. 4 in a position deviated from the prober, for the sake of convenience) of the wafer storage section 235 is specified. The tested wafers W can be stored in the vacant space 235V. If the wafer storage section 235 is specified as a storage place, for example, the arm mechanism 24 receives each tested wafer W from the main chuck 26 by means of the lower arm 241 after the inspection, and the tested wafer W is put into the vacant space 235V of the wafer storage section 235. The arm mechanism 24 stands ready to load another lot of wafers W. The arm mechanism 34 of the other AGV 3' loads new wafers W onto the support table 233 of the centering unit 23 in the same manner as previously mentioned. The upper arm 241 of the arm mechanism 24 delivers the new wafers W to the main chuck 26, whereupon the wafers W are tested. While the wafers W are being checked up, the tested wafers W in the wafer storage section 235 are returned to the AGV 3 by way of the support table 233. If the wafer storage section 235 of the centering unit 23 is empty when the new wafers W are loaded during the wafer inspection, the other AGV 3' puts the new wafers W into the wafer storage section 235, and waits for the wafer inspection to be finished.

Even if only the one support table 233 is used to deliver the wafers W, as described above, the wafer storage section 235 can be used as a buffer mechanism. In consequence, the wafers W can be delivered even when the tested wafers W remain in the prober 2, for example, so that the throughput of the inspection can be improved. In a conventional prober, the next AGV 3' cannot load another wafer W unless the preceding AGV 3 unloads each tested wafer W.

According to the present embodiment, as described above, the centering mechanism 234 can securely center the wafer W if the wafer W is delivered from the AGV 3 to the prober 2 with poor positional accuracy. In consequence, the wafer W can be securely delivered from the AGV 3 to the prober 2.

Thus, the wafers W can be securely delivered between the AGV 3 and the prober 2. As modern wafers have acquired larger diameters and hyperfine structures, the number of devices formed on each wafer has increased drastically and the processing time for each wafer has been lengthened considerably. Nevertheless, each tested wafer W can be unloaded and transferred directly to the next stage every time the inspection is finished. In consequence, the turn-around-time (TAT) can be shortened. The wafer storage section 235 of the centering unit 23 has a buffer function. When the wafers W are delivered from the AGV 3 to the prober 2, therefore, the support table 233 can receive a new wafer W after each tested wafer W is temporarily put into the wafer storage section 235. In consequence, the throughput of the inspection can be improved.

The present invention is not limited to the embodiment described above, and some changes in design may be effected as required therein. For example, the centering unit 23 according to the embodiment described above can correspond to wafers of two types, 200-mm and 300-mm types. Alternatively, however, the centering unit may be designed to correspond to wafers of only one type, or three or more types. Although the prober 2 has been described as an example of a semiconductor manufacturing apparatus, the present invention is also applicable to any other semiconductor manufacturing apparatuses that process wafers or other objects to be processed as specified.

According to the present invention, an object to be processed can be securely delivered between an automated transportation vehicle and a semiconductor manufacturing apparatus. The object can be temporarily stored depending its state of processing. In consequence, there may be provided a centering unit and a semiconductor manufacturing apparatus that improve the inspection throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A centering mechanism which centers a to-be-processed object, the mechanism comprising:

a support table to carry the to-be-processed object thereon;

at least one centering plate located on either side of the support table and having an engaging surface extending along the outer peripheral surface of the to-be-processed object; and a drive mechanism to move the centering plate relatively to the to-be-processed object, wherein the drive mechanism includes a link mechanism coupled to at least one of shafts supporting the centering plates and a cylinder mechanism coupled to the link mechanism.

2. A centering mechanism which centers a to-be-processed object, the mechanism comprising:

a support table to carry the to-be-processed object thereon, at least two centering plates located outward of the support table and having respective engaging surfaces extending along the outer peripheral surface of the to-be-processed object; and a drive mechanism to move the centering plates relatively to the to-be-processed object, wherein the drive mechanism includes link mechanisms coupled to shafts respectively supporting the centering plates and at least one cylinder mechanism coupled to each of the link mechanisms.

3. A centering mechanism according to claim 2, wherein each of the centering plates includes a plurality of engaging surfaces along the outer peripheral surfaces of a plurality of kinds of to-be-processed objects having different sizes.

4. A centering mechanism according to claim 3, which further comprises wafer storage chambers which have different sizes and are provided in tiers and adjacent to the centering mechanism.

5. A semiconductor manufacturing apparatus that has a main chuck to carry a to-be-processed object and a processing mechanism which performs a specific process on the to-be-processed object, the semiconductor manufacturing apparatus comprising:

a centering mechanism to center the to-be-processed object, the centering mechanism including a support table to carry the to-be-processed object thereon, at least one centering plate located on either side of the support table and having an engaging surface extending along the outer peripheral surface of the to-be-processed object, and a drive mechanism to move the centering plate relatively to the to-be-processed object; and a transportation mechanism which transports the to-be-processed object between the centering mechanism and the main chuck, wherein the drive mechanism includes a link mechanism coupled to at least one of shafts supporting the centering plates and a cylinder mechanism coupled to the link mechanism.

6. A semiconductor manufacturing apparatus that has a main chuck to carry a to-be-processed object and a processing mechanism which performs a specific process on the to-be-processed object, the semiconductor manufacturing apparatus comprising:

a centering mechanism to center the to-be-processed object, the centering mechanism including a support table to carry the to-be-processed object thereon, at least two centering plates located outward of the support table and having respective engaging surfaces extending along the outer peripheral surface of the to-be-processed object, and a drive mechanism to move each of the at least two centering plates relatively to the to-be-processed object; and a transportation mechanism which transports the to-be-processed object between the centering mechanism and the main chuck, wherein the drive mechanism includes link mechanisms coupled to shafts respectively supporting the centering plates, and a cylinder mechanism coupled to each of the link mechanisms.

7. A semiconductor manufacturing apparatus according to claim 6, wherein each of the centering plates has a plurality of engaging surfaces along the respective outer peripheral surfaces of a plurality of types of to-be-processed objects having different sizes.

8. A semiconductor manufacturing apparatus according to claim 7 which further comprises wafer storage chambers which have different sizes and are provided in tiers and adjacent to the centering mechanism.

9. A method of centering a to-be-processed object on a support table, the method comprising:

placing the to-be-processed object on the support table;

moving at least two centering plates toward the object, the at least two centering plates being located outward of the support table and having respective engaging surfaces extending along the outer peripheral surface of the to-be-processed object;

bringing the engaging surface of each of the at least two centering plates into contact with the outer peripheral surface of the to-be-processed object; and pressing the outer peripheral surface of the to-be-processed object by using the engaging surface of said each of the at least two centering plates to move the object, thereby locating the object in a center position, wherein the at least two centering plates are moved by at least one cylinder mechanism coupled to link mechanisms respectively coupled to shafts supporting the centering plates.

* * * * *